United States Patent [19]

Inoue et al.

[11] 4,143,343

[45] Mar. 6, 1979

[54] ACOUSTIC SURFACE WAVE INTERACTION DEVICE

[75] Inventors: Atushi Inoue; Hideharu Ieki, both of Nagaokakyo, Japan

[73] Assignee: Murata Manufacturing Co., Ltd., Nagaokakyo, Japan

[21] Appl. No.: 829,094

[22] Filed: Aug. 30, 1977

[30] Foreign Application Priority Data

Sep. 3, 1976 [JP] Japan .................... 51-106098
Jan. 18, 1977 [JP] Japan .................... 52-4778

[51] Int. Cl.² .............. H03H 9/04; H03H 9/26; H03H 9/32; H03H 41/10
[52] U.S. Cl. .................... 333/194; 333/151
[58] Field of Search .............. 333/72, 30 R, 71; 310/313

[56] References Cited

U.S. PATENT DOCUMENTS 3,633,132  1/1972  Hartemann .................. 333/30 R
3,675,054  7/1972  Jones et al. .................. 333/72 X

FOREIGN PATENT DOCUMENTS 1389337  4/1975  United Kingdom .................. 333/30 R Primary Examiner—Craig E. Church
Assistant Examiner—Marvin Nussbaum
Attorney, Agent, or Firm—Wenderoth, Lind & Ponack

[57] ABSTRACT

An acoustic surface wave interaction device includes a plate of dielectric material provided with two transducers each having at least one pair of comb-shaped electrode arrays having a plurality of teeth. The teeth in one comb-shaped electrode array of each pair are interleaved with the teeth of the other comb-shaped electrode array. At least one transducer has the pair of comb-shaped electrode arrays divided into two or more pairs of comb-shaped electrode arrays which are electrically connected in series, while the length of teeth is varied so that the tip ends thereof are enveloped by a curve representing the inverse Fourier transform of the transfer function of the device. The number of pairs of interleaving teeth to be included in one divided pair of electrode arrays is determined by the length of interleaving of the teeth in order to provide each divided pair of electrode arrays with the same impedance.

7 Claims, 16 Drawing Figures

ACOUSTIC SURFACE WAVE INTERACTION DEVICE

BACKGROUND OF THE INVENTION

The present invention relates to acousto-electric filters. More particularly, it relates to an improvement in solid-state tuned circuitry which involves interaction between a transducer device coupled to a piezoelectric material and acoustic surface waves propagated in that material.

Figure 1:
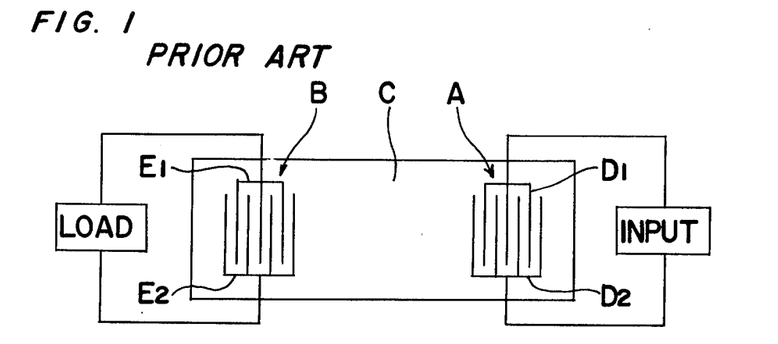
FIGS. 1 to 12 are drawings already referred to in the foregoing description, FIG. 1 being a principle circuit for the wave interaction device, FIGS. 2 and 3 being perspective views of conventional types of the wave interaction device, FIGS. 4 to 8 being schematic views of patterns of the lay out of electrodes for the transducer device of the conventional type wave interaction device, FIGS. 9 and 10 being graphs showing the relation between the amplitude of the propagated surface wave with respect to different frequencies, FIG. 11 being a graph showing the relation between attenuation and frequency, and FIG. 12 being a graph showing the relation between attenuation caused by the spurious response and the amount of interleaving.

In general an acousto-electric filter includes a pair of transducer devices provided on a piezoelectric material in which the acoustic surface waves propagating in the piezoelectric material interact with the transducers. More particularly, as shown in FIG. 1, the surface waves launched from one transducer device A on the surface of the body of the piezoelectric material are caused, in one manner or other, to interact with a second transducer B spaced along the surface from the first transducer A. In the general case, the first transducer is coupled to a source of signals as an input while the second transducer is coupled to a load. The signal energy is translated by the acoustic waves between the two transducers.

Figure 2:
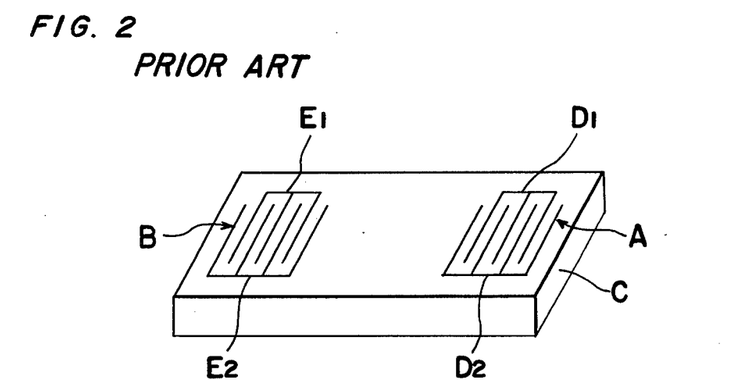
Figure 3:
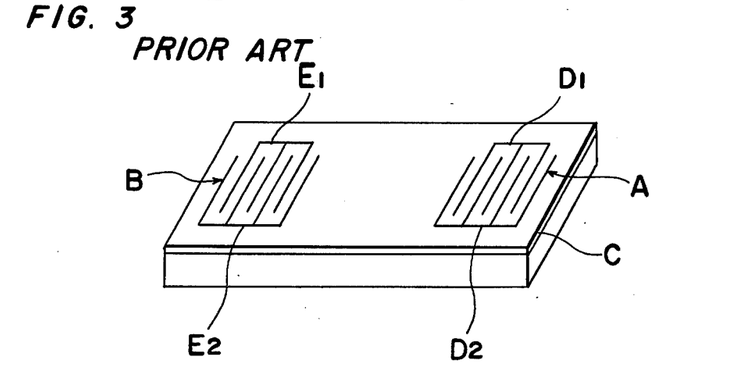

The piezoelectric material C is made of single crystal of $LiNbO_2$, or ceramics of PZT provided as a substrate as shown in FIG. 2, or a layer of ZnO provided over a substrate, as shown in FIG. 3. Each of the transducers includes a pair of electrodes $D_1$ and $D_2$ or $E_1$ and $E_2$, each of which is formed by a comb-shaped metal film the teeth of which are interleaved with one another. Each pair of teeth in the comb-shaped transducer exhibits resonance for an acoustic surface wave whose half-wavelength is normally equal to the distance between two adjacent teeth. The impedance represented by the wave interaction device is determined by the frequency of the wave to be propagated and also by the capacitance between the electrodes of the transducer device.

In practice, such devices have been demonstrated to exhibit characteristics useable in a number of different applications. In a television or FM stereo receiver, for example, acoustic filter systems have been included in the intermediate-frequency (IF) channel in order to impose a desired IF characteristic with traps or null points at selected frequencies spaced from the IF carrier frequency determined by the structure of components of the acoustic filter system. As another example, an acoustic filter may serve in a frequency-modulation (FM) receiver as the discriminator to perform the necessary function of converting frequency changes to amplitude changes.

While the demonstrations thus far have been highly encouraging, one difficulty encountered has been that, in some system applications, the impedance presented by the wave interaction devices to associate circuitry or other devices is considerably less than that desired for the purpose of obtaining optimum matching and signal transfer characteristics.

In order to eliminate this difficulty, there have been proposed various types of transducer devices.

Figure 4:
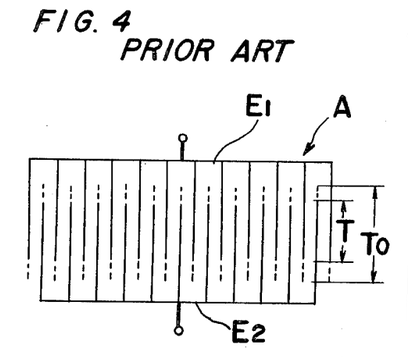
Figure 5:
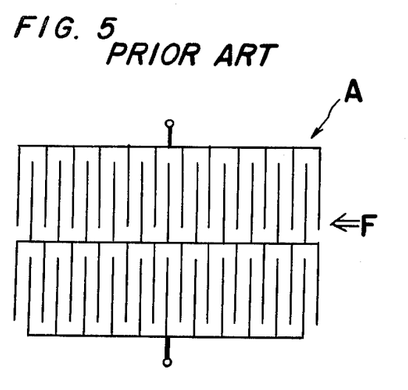
Figure 6:
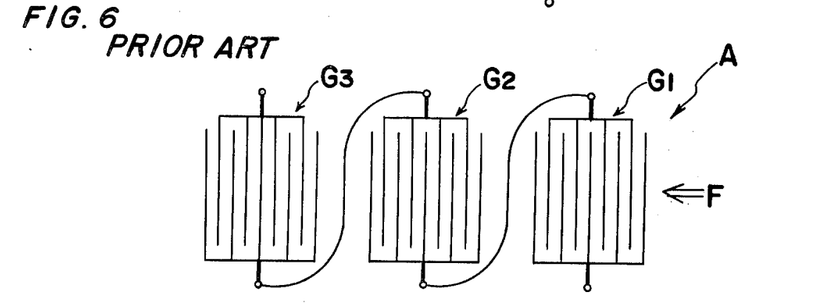

According to one type of transducer device, the comb-shaped electrodes have an amount of interleaving, that is the distance which the teeth interleave with each other, arranged to be less than that of the conventional type. More particularly, this type of transducer device, as shown in FIG. 4, has interleaving amount T smaller than the interleaving amount $T_0$ of the conventional type, so that the capacitance between the electrodes will be less than that of the conventional type. Other types of transducer devices have another electrode structure, as shown in FIGS. 5 and 6, to reduce the capacitance between the electrodes, in other words, to increase the impedance. The structure of electrodes shown in FIG. 5 has two parts which are connected series and are disposed in such that each of the two parts is in alignment with the direction F of propagation of the wave while the two parts are parallely aligned to each other. The electrode structure shown in FIG. 6 is presented by three parts $G_1$, $G_2$ and $G_3$, each part having same number of pairs of interleaving teeth as the other parts. The three parts are connected in series and are disposed such that each of the three parts is in alignment with the direction F of propagation of the wave while the three parts aligned with each other. In either of the above described cases, the division of the electrodes results in reduction of capacitance between the input terminals.

Figure 9:
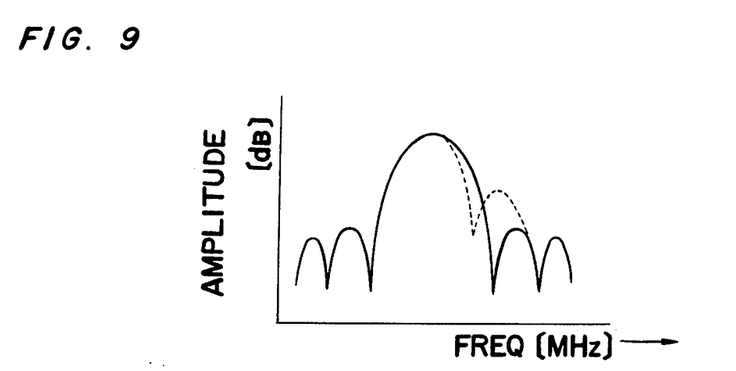

However, according to first two types of transducer devices shown in FIGS. 4 and 5, the decrease in the amount of interleaving results in an undesirable expansion of acoustic surface waves emanating from each pair of neighboring teeth. Thus, the amplitude-frequency characteristics obtained from these types of transducer devices will deviate from the required characteristics, as shown in the graph of FIG. 9, in which the curve represented by a solid line shows the desired characteristics while the curve represented by a dotted line shows the characteristics obtained from the first two types of transducers.

Figure 7:
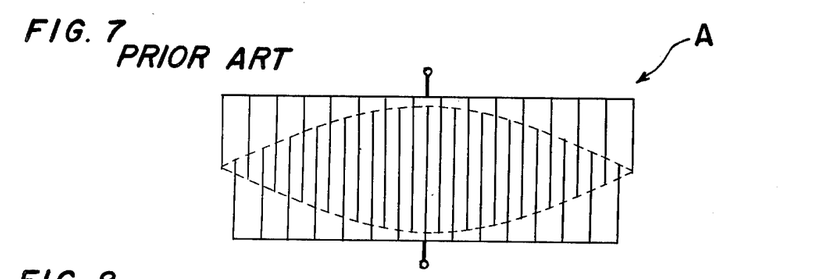

Furthermore, according to all three types of transducer devices described above, because the amount of interleaving of all the pairs of teeth is equal to each other an unbalance results in the received surface wave vibratory energy which is emanated from the transducer device A. Accordingly, there have been proposed another conventional type of transducer device which varies the amount of interleaving of the pairs of teeth, in a manner as shown in FIG. 7, so as to improve the selectivity characteristics in the transfer function of these devices.

Figure 8:
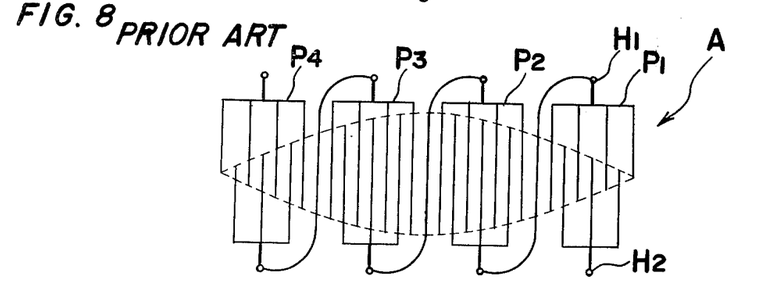

The electrode structure shown in FIG. 8 takes the advantage of the reduced capacitance between the two input terminals by equally dividing the pairs of teeth into a plurality of parts, such as four, as shown in this instance and also reducing the loss of the vibratory energy to be propagated by varying the amount of interleaving of the pairs of teeth.

Figure 10:
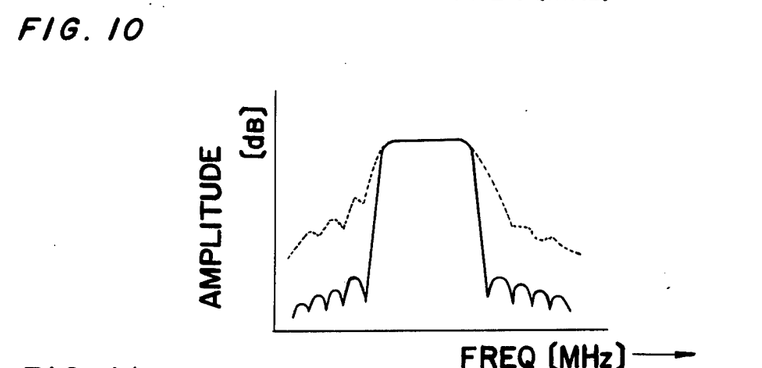

However, according to this conventional type of transducer device as shown in FIG. 8, the voltage drop at one part of the transducer device, such as $P_1$, and particularly between the terminals $H_1$ and $H_2$, results in a different voltage from the other parts of the transducer device such as $P_2$, so that the amplitude of the propagation of the surface wave will be deteriorated as shown in FIG. 10. In FIG. 10 curve represented by a solid line shows the desired characteristics while the curve represented by a dotted line shows the characteristics obtained from the above described type of transducer.

Figure 11:
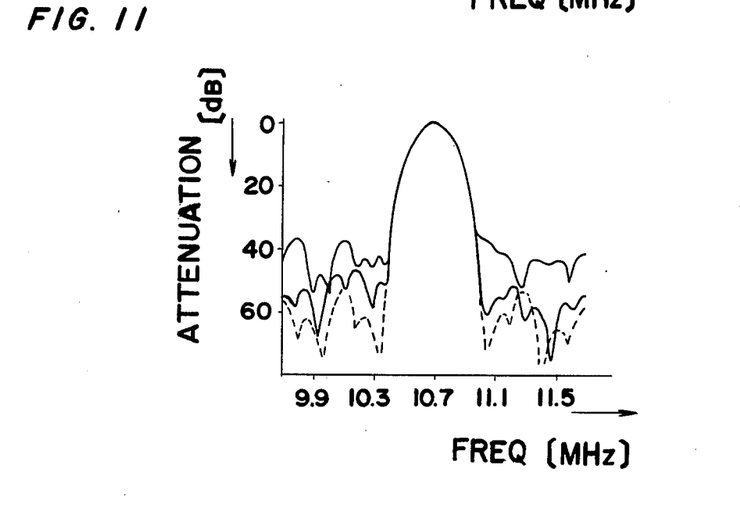

Furthermore, in the case where the piezoelectric material is a material having a high dielectric constant such a PZT, the degree of capacitance between the adjacent electrodes will be undesirably increased, while at the same time, the response of the spurious mode will be undesirably increased, so that the vibratory energy of the surface wave is undesirably expanded to deviate from a required characteristics, as shown in FIG. 11. In FIG. 11 the curve represented by the dotted line shows the desired characteristics while the curve represented by the thin solid line shows the characteristics obtained from the above described type of transducer device. In this case, in order to decrease the capacitance, the structure of the pairs of electrodes is separated into a plurality of parts as understood from the foregoing description. However, this separation will not improve the response of the spurious mode to be suppressed.

Figure 12:
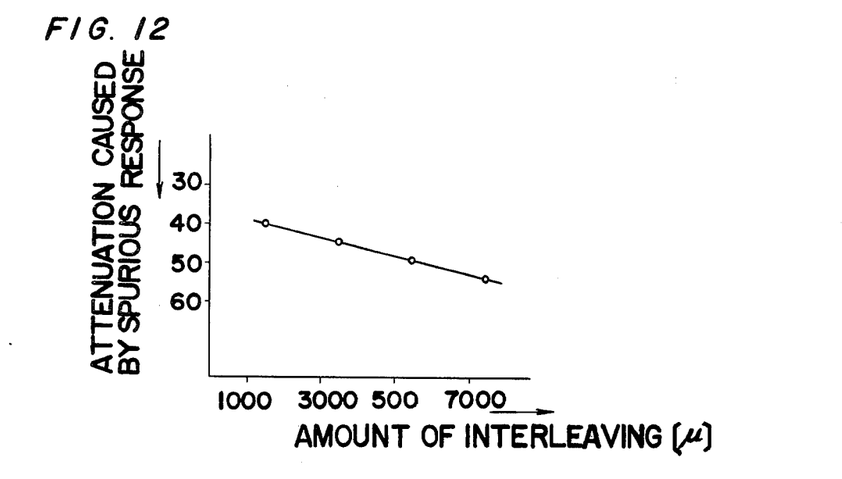

According to the tests carried out by the inventors, it is found that an incease in the amount of interleaving improves the response of the spurious mode to be suppressed to a desirable amount as shown in FIG. 12, wherein the abscissa represents the maximum amount of interleaving and the ordinate represents the attenuation caused by the spurious response.

Accordingly, a primary object of the present invention is to provide an improved type of a surface wave interaction device which provides an optimum capacitance between the opposite input terminals while propagating vibratory energy without causing an undesirable expansion in vibratory energy.

Another object of the present invention is to provide a surface wave interaction device of the above described type in which the spurious made response is improved.

Yet another object of the present invention is to provide a wave interaction device of the above described type which is simple in construction and can be readily manufactured.

SUMMARY OF THE INVENTION

In order to accomplish these and other objects, the surface wave interaction device of the present invention includes a body of piezoelectric material propagative of acoustic surface waves along a surface thereof and at least two transducer devices coupled to the surface of this piezoelectric material in a spaced relation to each other. The first transducer device is provided to emanate surface wave therefrom upon receipt of electric signals from external circuitry and the second transducer device is provided to receive the surface wave emanated from the first transducer device so as to further transmit the wave to an external load connected thereto. Each of the transducer devices includes at least one pair of comb-shaped electrode arrays each having a plurality of teeth, the teeth of one of the arrays of the pair being interleaved with the teeth of the other of the arrays of the pair. At least one of the transducer devices has two or more pairs of comb-shaped electrode arrays which are electrically connected in series. The length which the teeth are interleaved with the corresponding teeth, referred to as the amount of interleaving, is varied as in the conventional type of transducer device. The number of pairs of interleaving teeth in one pair of electrode arrays is determined by the amount of interleaving so that the pair of electrode arrays in which the amount of interleaving is comparatively small has comparatively large numbers of pairs of interleaving teeth. Preferably, the total amount of interleaving obtained by adding the amount of interleaving in each pair of interleaving teeth in one pair of electrode arrays should be approximately equal to that in the other pairs of electrode arrays, so as to equalize the capacitance of one pair of electrode arrays with that of the other pairs of electrode arrays.

In the case where it is desired to improve the spurious mode response to be suppressed to a desirable amount, the amount of interleaving is increased by predetermined rates. The rates for increasing the amount of interleaving is greatest in the pairs of electrode arrays positioned at the opposite ends of the transducer device, while this rate is gradually reduced towards the pair of electrode arrays positioned at the center of the transducer device. Accordingly, the tip ends of the interleaving teeth form the discontinuous envelope of a curve. More particularly, the tip ends of the teeth are enveloped in the manner as described hereinbelow. The pairs of electrode arrays positioned at opposite ends have the tip ends of the teeth enveloped by a curve which is larger than the curve representing the inverse Fourier transform of the transfer function of the device by a first predetermined rate, while the pairs of electrode arrays positioned intermediate between electrode arrays positioned at opposite ends have the tip ends of the teeth enveloped by curves which are larger than the curve representing the inverse Fourier transform of the transfer function of the device by respective predetermined rates. Each of the respective predetermined rates is smaller than the first predetermined rate and the respective predetermined rates are gradually reduced towards the pair of electrode arrays positioned at center. Furthermore, the pair of electrode arrays positioned at center have the tip ends of the teeth enveloped by the curve representing the inverse Fourier transform of the transfer function of the device. Here, it is to be noted that the curves which are larger than the curve representing the inverse Fourier transform of the transfer function of the device do not exceed the maximum of the curve representing the inverse Fourier transform of the transfer function of the device.

These and other objects and features of the present invention will become apparent from the following description taken in conjunction with preferred embodiments described with reference to the accompanying drawings in which.

Figure 13:
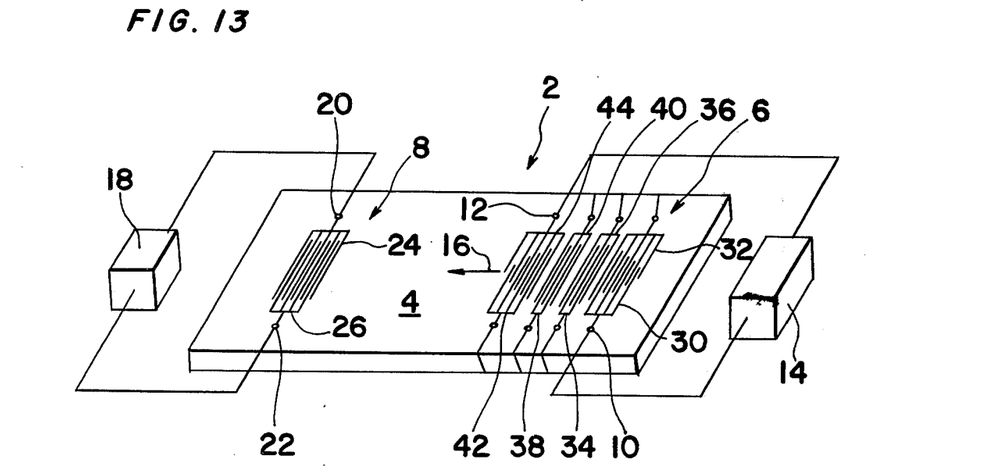
FIG. 13 is a perspective view particularly showing a wave interaction device of the present invention.
Figure 14:
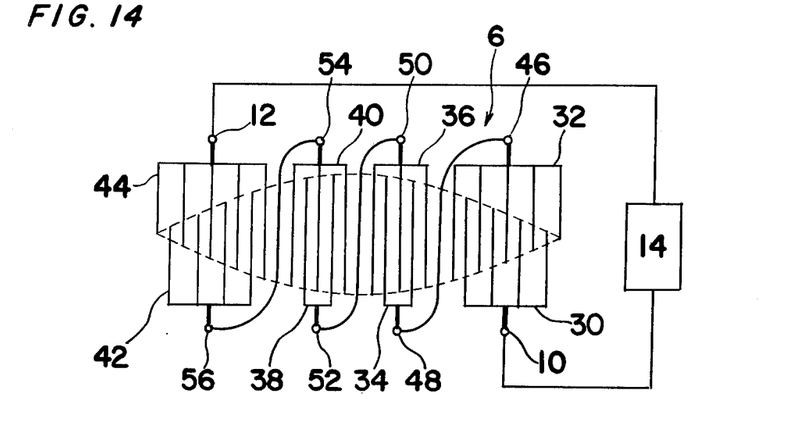
FIG. 14 is a schematic view showing the pattern of electrodes to be employed in the surface wave interaction device shown in FIG. 13.
Figure 15:
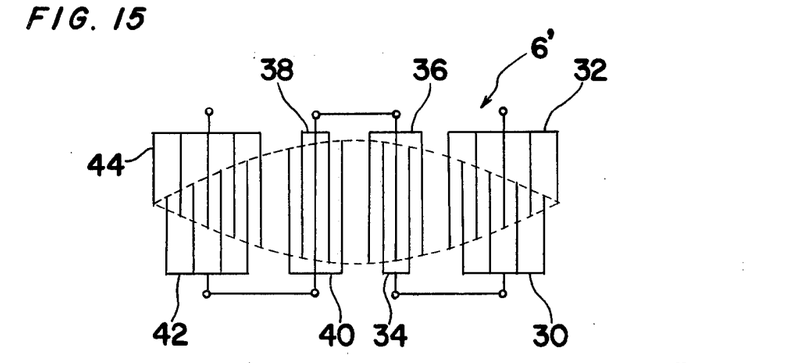
FIGS. 15 and 16 are views similar to FIG. 14, but particularly showing modifications thereof.

Referring to FIG. 13, the surface wave interaction device 2 of the present invention comprises a body 4 of piezoelectric material propagative of acoustic surface waves along the surface thereof and at least two transducer devices 6 and 8 coupled to the surface of the piezoelectric material 4 in a spaced relation to each other. A pair of input terminals 10 and 12 of the transducer device 6 is connected to an external circuitry 14 for generating and emanating acoustic surface waves in the direction indicated by the arrow 16 toward the other transducer device 8. The other transducer device 8 provided to receive the acoustic surface wave is connected to an external load 18 through a pair of output terminals 20 and 22. Provided in the transducer device 8, particularly between the terminals 20 and 22 are a pair of comb-shaped electrode arrays 24 and 26 each having a plurality of teeth, the teeth of one of the arrays of the pair being interleaved with the teeth of the other of the arrays of the pair as shown in FIG. 13. The number of pairs of interleaving teeth, determined by counting the numbers of spaces formed between adjacent teeth, in the transducer device 8 is determined by various operating conditions such as the amount of vibratory energy of the wave, etc. As one example, the number of pairs of interleaving teeth in the transducer device 8 may be 28 pairs, although the transducer device 8 shown in FIG. 13 is illustrated as having only 8 pairs of electrodes for the sake of brevity. Similarly, provided in the transducer 6, particularly between the terminals 10 and 12 referred to as the main terminals, are a plurality of pairs of comb-shaped electrode arrays 30, 32, 34, 36, 38, 40, 42 and 44, shown as four pairs as an instance, and each array having a plurality of teeth. The number of pairs of interleaving teeth in the transducer device 6 is also determined by the various operating conditions as described above. As one example, the number of pairs of interleaving teeth in the transducer device 6 may be 62 pairs, although the transducer device 6 or 6' shown in FIGS. 13-15 is not illustrated with this number of pairs of electrodes for the sake of brevity. The arrangement of the comb-shaped electrode arrays 30, 32, 34, 36, 40, 42 and 44, as well as the connections thereof is shown schematically in FIG. 14.

Rererring particularly to FIG. 14, the comb-shaped electrode array 30 connected to the external circuit 14 through the terminal 10 thereof has a plurality of teeth which are interleaved with a plurality of teeth of a corresponding comb-shaped electrode array 32. A terminal 46 of the comb-shaped electrode array 32 is connected to a terminal 48 of the electrode array 34 whose teeth are interleaved with a corresponding electrode array 36. In a similar manner, the remaining corresponding pairs of electrode arrays are connected in series through terminals 50, 52, 54, 56 and 12 to the external circuit 14. Here, the wave length of the surface wave produced at the central frequency may be 214μ.

The interleaving teeth in any one pair of electrode arrays are equidistant from one another while the length of the teeth interleaving with the corresponding teeth i.e., the amount of interleaving, is varied forming an envelope represented by a dotted line when the tips of the teeth in the electrode arrays are interlinked with each other. The maximum amount of interleaving may be, for example, 1500μ. It is to be noted that the shape of the envelope is defined by the inverse Fourier transform of the transfer function of the device, so that the shape may be changed with respect to the change of condition of the transfer function.

The number of pairs of interleaving teeth to be included in one particular pair of electrode arrays, for example, electrode arrays 30 and 32, is determined by the capacitance, i.e., the voltage drop across respective pairs of electrode arrays. The voltage drop across one pair of electrode arrays, such as electrode arrays 30 and 32 is arranged to be equal to that of the other pairs of electrode arrays. Accordingly, in this case, the voltage across any one pair of electrode arrays is equal to ¼ of the voltage across the main terminals 10 and 12. In other words, the capacitance or impedance across the terminals of one pair of electrode arrays is equal to that of the other pairs of electrode arrays. Therefore, the number of the teeth included in the pair of electrode arrays is relatively great where the interleaving teeth have a small amount of interleaving while the number is relatively small where the interleaving teeth have a large amount of interleaving.

According to the surface wave interaction device of the present invention, as described above, the division of the pair of electrode arrays into a plurality of pairs such as four pairs as shown in FIG. 14 or 15 provides an improvement by decreasing the capacitance of the transducer. For example, in the case where the electrode arrays are divided into four pairs of electrode arrays as shown in FIG. 14, the capacitance of the transducer device 6, i.e., between the main terminals 10 and 12, will be decreased to 1/16 of the capacitance of the conventional type of transducer device as shown in FIG. 7.

Note that the transducer device 8 may be constructed in a manner similar to that of the transducer device 6 so that both transducer devices 6 and 8 have the same structure.

Note also that the transducer 6 may be connected to the load 18 while the transducer 8 may be connected to the external circuit 14 to cause the transducer 8 to produce surface waves and the transducer 6 to receive the surface waves.

Note further that the pair of electrode arrays 38 and 40, shown in FIG. 14 as having the electrode array 40 being positioned on the upper side and the electrode array 38 being positioned on the lower side, may be presented in an inverted relation as shown in FIG. 15 so as to facilitate the electrical connection of the arrays.

Note still further that in the case where the body 4 of piezoelectric material is a material having high dielectric constant such as PZT, the reduction of the impedance between the main terminals, due to the nature of this material, can be easily increased to a desired amount by further dividing the electrode arrays into a large number of pairs such as five pairs, and still maintain the emanated surface wave in the desirable condition.

In the case where the electrode arrays are further divided into larger number of pairs such as six to reduce the capacitance of transducer device, the total amount of interleaving in one pair of divided electrode arrays will also be reduced, so that the spurious mode response will be undesirably increased. In order to decrease the spurious mode response, the amount of interleaving is increased in each pair of divided electrode arrays in a manner described hereinbelow.

Figure 16:
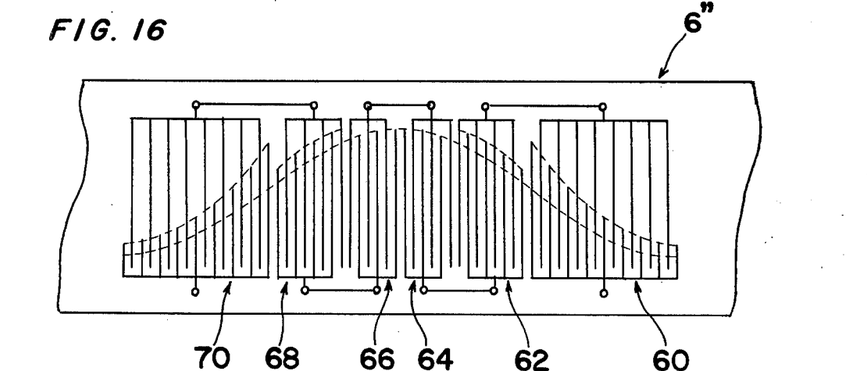

Referring to FIG. 16, there is shown a transducer device 6" which is a modification of the transducer 6' shown in FIG. 15. The transducer device 6" comprises six pairs of electrode arrays 60, 62, 64, 66, 68 and 70. The shape of envelope originally formed by the inverse Fourier transform of the transfer function of device before increasing the amount of interleaving is illustrated by a dotted line. As apparent from the drawing, the interleaving teeth in the pairs of electrode arrays 60 and 70 positioned at opposite ends are increased by a predetermined amount, for example, a ratio of 1.5. from the original amount of interleaving, while the interleaving teeth in the pairs of electrode arrays 62 and 68 positioned intermediate between the pairs of electrode arrays at opposite ends are increased by a smaller predetermined amount, for example, a ratio of 1.1, from the original amount of interleaving, and the interleaving teeth in the pairs of electrode arrays 64 and 66 positioned at the center between opposite ends remain the same as the original amount.

These ratios as described above may be varied with respect to the required degree of change of the spurious mode response. However, note that the ratio for increasing the amount of interleaving should be greatest for the pairs positioned at opposite ends and decreased towards the center for the pairs positioned intermediate between the opposite ends.

Note also that the maximum length of interleaving teeth obtained in the above described manner should not exceed the maximum length of interleaving teeth in the original arrangement.

The transducer device 6" shown in FIG. 6 provides an advantage in that variation of the amount of interleaving of the teeth in the manner described above prevents the emanated surface wave from undesirable expansion without deteriorating the impedance (capacitance) of the transducer.

Although the amount of interleaving is increased to provide a discontinuous envelope, the vibratory energy is preferably produced and emanated from the transducer device 6" for the reasons set forth hereinbelow.

Generally, the vibratory energy produced from the interleaving teeth is proportional to the voltage across the pair of interleaving teeth and also to the amount of interleaving. Accordingly, an increase in the amount of interleaving causes a decrease in the impedance between the interleaving teeth, thus the voltage across the interleaving teeth is decreased. As a consequence, the increase of the vibratory energy caused by the increase in the amount of interleaving is counterbalanced by the decrease of the voltage, and thus, the vibratory energy is maintained substantially constant regardless of change in the amount of interleaving.

The thick solid line shown in the graph of FIG. 11 illustrates the characteristic curve obtained from the transducer of FIG. 16.

Therefore, with this simple construction of the surface wave interaction device, the capacitance of the transducer can be increased by a required degree to provide an optimum impedance for matching with the external circuit connected thereto, while the spurious mode response may be, if necessary, suppressed to a desirable amount and while preventing the vibratory energy of the surface wave from being undesirably expanded.

Although the present invention has been fully described by way of examples with reference to the accompanying drawings, note that various changes and modifications are apparent to those skilled in the art. Therefore, unless these changes and modifications depart from the scope of the present invention, they should be construed as included therein.

What is claimed is:

1. In an acoustic surface wave interaction device including a body of peizoelectric material propagative of acoustic waves along a surface thereof and a transducer arrangement actively coupled to said surface for effecting change between electrical energy and acoustic surface wave energy, the improvement in which;

said transducer arrangement has a plurality of pairs of comb-shaped electrode arrays which are electrically connected in series and which are disposed in alignment with each other to effect interaction with said surface waves, each electrode array having a plurality of teeth, the tip ends of said plurality of teeth being enveloped by a curve representing the inverse Fourier transform of the transfer function of the device, the teeth of one of the arrays of each of said pairs being inter-leaved with the teeth of the other of the arrays of said pair so as to form a plurality of interleaving teeth, the amount of interleaving between said plurality of interleaving teeth and number of interleaving teeth included in each of said pairs of comb-shaped electrode arrays selected such that the number of interleaving teeth is relatively great where said plurality of interleaving teeth have a small amount of interleaving and the number of interleaving teeth is relatively small where said plurality of interleaving teeth have a large amount of interleaving, for making the impedance of each of said plurality of pairs of comb-shaped electrode arrays equal.

2. An acoustic surface wave interaction device as claimed in claim 1, wherein said plurality of pairs of comb-shaped electrode arrays is four pairs.

3. An acoustic surface wave interaction device as claimed in claim 1, wherein said transducer arrangement is provided to emanate acoustic surface wave therefrom upon receipt of an electric signal applied thereto.

4. An acoustic surface wave interaction device as claimed in claim 1, wherein said transducer arrangement is provided to receive acoustic surface wave thereto to produce an electrical signal therefrom.

5. In an acoustic surface wave interaction device including a body of peizoelectric material propagative of acoustic waves along a surface thereof and a transducer arrangement actively coupled to said surface for effecting change between electrical energy and acoustic surface wave energy, the improvement in which;

said transducer arrangement has a plurality of pairs of comb-shaped electrode arrays which are electrically connected in series and which are disposed in alignment with each other to effect interaction with said surface waves, each electrode array having a plurality of teeth, the tip ends of said plurality of teeth being enveloped in such a manner that the pairs of electrode arrays positioned at opposite ends of the transducer arrangement have the tip ends of said plurality of teeth enveloped by a curve which is larger than a curve representing the inverse Fourier transform of the transfer function of the device by a first predetermined rate, and that the pairs of electrode arrays positioned intermediate between electrode arrays positioned at opposite ends of the transducer arrangement have the tip ends of said plurality of teeth enveloped by curves which are larger than said curve representing the inverse Fourier transform of the transfer function of the device by further respective predetermined rates, each of said further respective predetermined rates being smaller than said first predetermined rate and said further respective predetermined rates being gradually reduced towards the pair of electrode arrays positioned at the center of the transducer arrangement and that the pair of electrode arrays positioned at the center of the transducer arrangement have the tip ends of said plurality of teeth enveloped by said curve representing the inverse Fourier transform of the transfer function of the device, and that the curves which are larger than said curve representing the inverse Fourier transform of the transfer function of the device do not exceed the maximum of said curve representing the inverse Fourier transformer of the transfer function of the device, the teeth of one of the arrays of each of said pairs being interleaved with the teeth of the other of the arrays of said pair so as to form a plurality of interleaving teeth, the amount of interleaving between said plurality of interleaving teeth and number of interleaving teeth included in each of said paris of comb-shaped electrode arrays being selected such that the number of interleaving teeth is relatively great where said plurality of interleaving teeth have a small amount of interleaving and the number of interleaving teeth is relatively small where said plurality of leaving teeth have a large amount of interleaving for making the impedance of each of said plurality of pairs of comb-shaped electrode arrays equal.

6. An acoustic surface wave interaction device as claimed in claim 5, wherein said plurality of pairs of comb-shaped electrode arrays is six pairs.

7. An acoustic surface wave interaction device as claimed in claim 6, wherein said first predetermined rate is 1.5 and where said predetermined rate for the pairs of electrode arrays positioned adjacent to those positioned at opposite ends of the transducer arrangement is 1.1.

* * * * *